United States Patent
Robinson

(10) Patent No.: US 7,057,715 B2
(45) Date of Patent: Jun. 6, 2006

(54) LITHOGRAPHY TOOL TEST PATTERNS AND METHOD

(75) Inventor: Christopher F. Robinson, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 237 days.

(21) Appl. No.: 10/604,151

(22) Filed: Jun. 27, 2003

(65) Prior Publication Data

US 2004/0265711 A1 Dec. 30, 2004

(51) Int. Cl.
*G01B 9/00* (2006.01)
*G03F 1/00* (2006.01)
*G03F 9/00* (2006.01)
*G03F 5/00* (2006.01)

(52) U.S. Cl. ............................ 356/124; 430/5; 430/22; 430/30

(58) Field of Classification Search ........ 356/399–401, 356/124; 355/53, 55, 77; 430/5, 22, 30; 250/548

See application file for complete search history.

(56) References Cited

U.S. PATENT DOCUMENTS

| 4,644,637 | A | * | 2/1987 | Temple ...................... 438/138 |
| 5,308,682 | A | * | 5/1994 | Morikawa ................ 428/195.1 |
| 5,847,818 | A | * | 12/1998 | Lin et al. ................. 356/124.5 |
| 6,765,282 | B1 | * | 7/2004 | Schulz ....................... 257/629 |
| 2003/0165749 | A1 | * | 9/2003 | Fritze et al. ................... 430/5 |
| 2004/0165194 | A1 | * | 8/2004 | Hansen ....................... 356/521 |

* cited by examiner

*Primary Examiner*—Gregory J. Toatley, Jr.
*Assistant Examiner*—Gordon J. Stock, Jr.
(74) *Attorney, Agent, or Firm*—James J. Cioffi; Hoffman, Warnick & D'Alessandro LLC

(57) ABSTRACT

Test patterns and a method for evaluating and adjusting the resolution of an electron beam lithography tool. The test patterns include multiple feature patterns that are repeated throughout the test pattern. Each feature pattern can be interleaved with horizontal and/or vertical line patterns that facilitate cleaving of a test substrate for three dimensional analysis of the developed image. Further, each feature pattern can comprise multiple sub-patterns. Each sub-pattern includes at least one feature having a size that varies from less than a nominal resolution limit of the lithography tool to greater than the nominal resolution limit. The lithography tool resolution can be evaluated by exposing a test pattern on a resist coated substrate, and analyzing the developed image.

20 Claims, 9 Drawing Sheets

LITHOGRAPHY TOOL TEST PATTERNS AND METHOD

BACKGROUND OF INVENTION

The invention relates generally to testing the resolution of an electron beam lithography tool, and more specifically to a method and patterns for efficiently evaluating the resolution.

Currently, the resolution of a lithography tool is measured by exposing a test pattern that is designed for a particular set of critical dimension (CD) measurements. Critical dimension measurements represent the smallest feature size (i.e., line or space width) obtainable from a lithographic process. However, the resolution test pattern is often not designed to provide insight to the lithography tool factors that limit performance. As a result, a separate set of exposures of specialized patterns may be required to determine which exposure conditions of lithography tool must be adjusted to improve the resolution. Exposure conditions that are typically adjusted include focus coil excitation, stigmator corrector excitation, and beam exposure time. Once the lithography tool performs at a desired level, the resolution test pattern will be exposed again for final verification.

However, the current process wastes both lithography tool time as well as space in the test patterns. For example, a test pattern may comprise several groups of interleaved lines and spaces (i.e., "finger arrays") for measuring the resolution of the lithography tool. While such a test pattern allows for thorough testing of various combinations of line and space widths, additional test patterns must be exposed to effectively analyze other feature types (e.g., contact holes).

As a result, a need exists for improved test patterns that more efficiently evaluate the resolution of a lithography tool and provide the information necessary to improve the resolution. Further, a need exists for an improved method of evaluating and adjusting the lithography tool using these test patterns.

SUMMARY OF INVENTION

The invention provides a method and patterns for efficiently evaluating and adjusting the resolution of a lithography tool. In particular, a test pattern is provided that includes a feature pattern that is repeated in several different locations in the test pattern. In one embodiment, the feature pattern is located at the center of the test pattern, each corner of the test pattern, and the midpoints of each radius and side of the test pattern. The feature pattern can include sub-patterns that test multiple exposure characteristics of the lithography tool. For example, isolated lines, isolated spaces, and finger arrays can be provided as well as multiple sets of holes having positive tone and/or negative tone. The feature pattern can be interleaved in the test pattern with horizontal line patterns and vertical line patterns that are arranged throughout the test pattern to facilitate cleaving of the lines for three dimensional image analysis. A method of evaluating the lithography tool resolution is also presented in which the test pattern is exposed one or more times on a resist coated substrate by the lithography tool and one or more test pattern images are generated for analysis. Each exposure can use varying exposure conditions. Adjustments can be made to the lithography tool based on the analysis of the test pattern image(s). Correct exposure dosage conditions for resolution evaluation can be assured by comparing incorporated sets of positive and negative tone hole arrays.

A first aspect of the invention provides a test pattern comprising: a plurality of feature patterns; a plurality of horizontal line patterns; and a plurality of vertical line patterns, wherein the feature patterns are interleaved with the horizontal line patterns and the vertical line patterns.

A second aspect of the invention provides a test pattern comprising: a plurality of feature patterns, wherein each feature pattern includes a plurality of sub-patterns that include: a set of finger arrays; a plurality of sets of positive tone holes; and a plurality of sets of negative tone holes; wherein each sub-pattern includes at least one feature that varies in size from less than a nominal resolution limit of a lithography tool to greater than the nominal resolution limit.

A third aspect of the invention provides a method of evaluating a lithography tool resolution, the method comprising: exposing a test pattern on a resist coated substrate and generating a test pattern image, wherein the test pattern includes: a plurality of horizontal line patterns; a plurality of vertical line patterns; and a plurality of feature patterns interleaved with the horizontal line patterns and the vertical patterns; and analyzing the test pattern image to evaluate the lithography tool resolution.

The illustrative aspects of the present invention are designed to solve the problems herein described and other problems not discussed, which are discoverable by a skilled artisan.

BRIEF DESCRIPTION OF DRAWINGS

These and other features of this invention will be more readily understood from the following detailed description of the various aspects of the invention taken in conjunction with the accompanying drawings in which.

Figure 1:
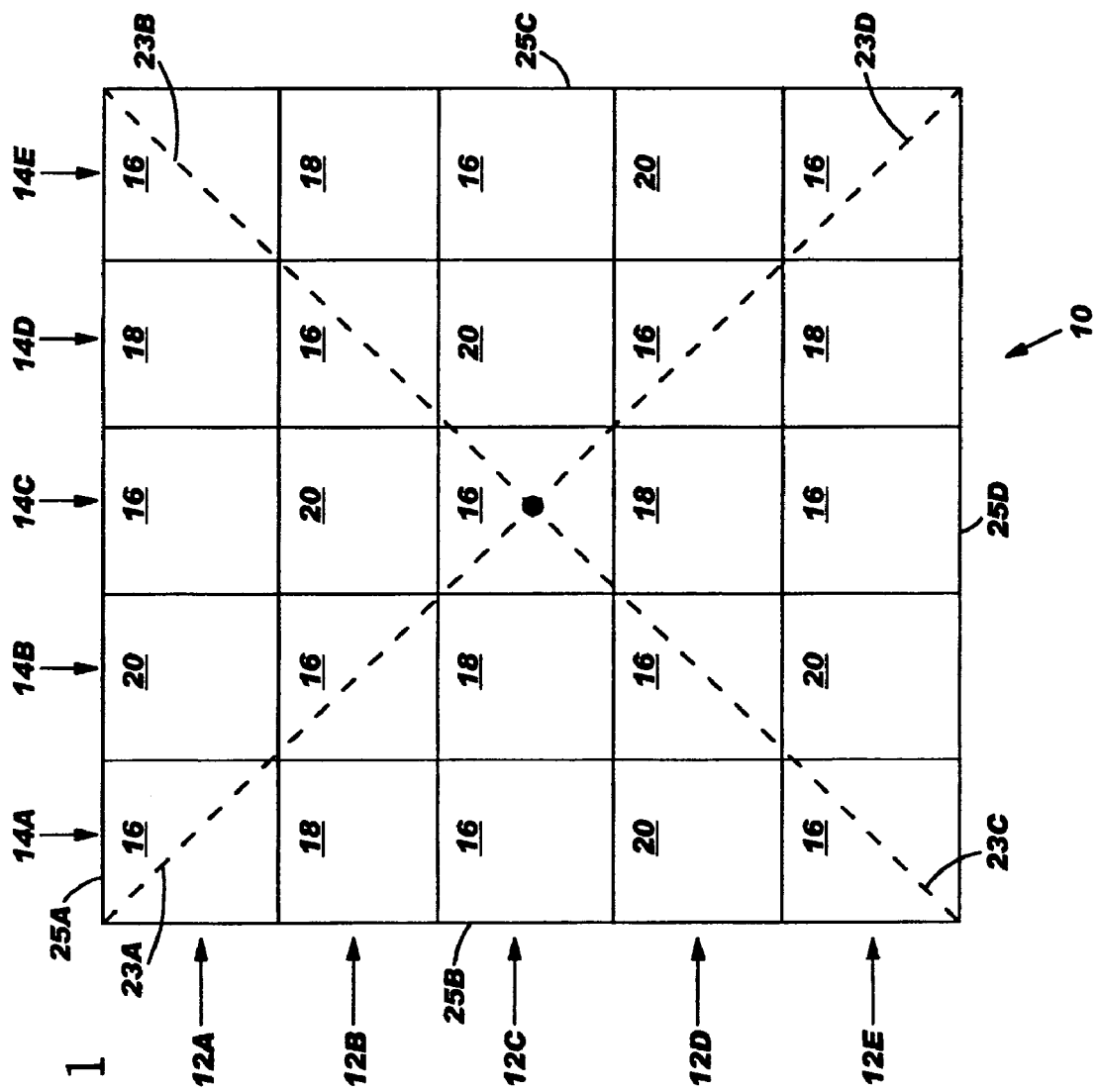
FIG. 1 shows a schematic representation of an illustrative test pattern that includes interleaved patterns according to one embodiment of the invention.

It is noted that the drawings of the invention are not to scale. The drawings are intended to depict only typical embodiments of the invention, and therefore should not be considered as limiting the scope of the invention. In the drawings, like numbering represents like elements between the drawings.

DETAILED DESCRIPTION

The invention provides a method and patterns for efficiently evaluating and adjusting the resolution of a lithography tool. In particular, a test pattern is provided that includes a feature pattern that is repeated in several different locations in the test pattern. In one embodiment, the feature pattern is located at the center of the test pattern, each corner of the test pattern, and the midpoints of each radius and side of the test pattern. The feature pattern can include subpatterns that test multiple exposure characteristics of the lithography tool. For example, isolated lines, isolated spaces, and finger arrays can be provided as well as multiple sets of holes having positive tone and/or negative tone. The feature pattern can be interleaved in the test pattern with horizontal line patterns and vertical line patterns that are arranged throughout the test pattern to facilitate cleaving of the lines for three dimensional image analysis. A method of evaluating the lithography tool resolution is also presented in which the test pattern is exposed one or more times on a resist coated substrate by the lithography tool and one or more test pattern images are generated for analysis. Each exposure can use varying exposure conditions. Adjustments can be made to the lithography tool based on the analysis of the test pattern image(s). Correct exposure dosage conditions for resolution evaluation can be assured by comparing incorporated sets of positive and negative tone hole arrays.

Turning to the drawings, FIG. 1 shows a schematic representation of a test pattern 10 according to one embodiment of the invention. Test pattern 10 is shown including five rows 12A–E and five columns 14A–E that form sections within test pattern 10. Each section is denoted by the corresponding row and column in which it is located. Consequently, the upper leftmost section is denoted as section 12A, 14A. Each section is shown including one of three patterns 16, 18, 20.

Pattern 16 comprises a feature pattern. Each feature pattern 16 can include one or more sub-patterns of various sizes and shapes that enable multiple exposure characteristics of the lithography tool to be evaluated by a single exposure of test pattern 10. An illustrative feature pattern having multiple sub-patterns will be discussed further below with reference to FIGS. 5–13. In test pattern 10 (FIG. 1), feature pattern 16 can be interleaved with patterns 18 and/or patterns 20. In one embodiment, feature pattern 16 is located at the center section 12C, 14C of test pattern 10. Further, each corner of test pattern 10, i.e., section 12A, 14A, section 12E, 14A, section 12A, 14E, and section 12E, 14E may include a feature pattern 16. Still further, a midpoint of each radius axis 23A–D of test pattern 10 (i.e., section 12B, 14B, section 12D, 14B, section 12B, 14D, and section 12D, 14D) and/or a midpoint of each side 25A–D of test pattern 10 (i.e., section 12C, 14A, section 12A, 14C, section 12E, 14C, and section 12C, 14E) may also include a feature pattern 16. By locating feature patterns 16 in this manner, one or more exposure characteristics of a lithography tool can be evaluated as a function of location in an exposure field. For example, each feature pattern 16 exposed by a lithography tool can be compared to one or more of the other exposed feature patterns 16 to determine any differences between them. Any differences would indicate that an exposure characteristic of the lithography tool changes depending on a location in the exposure field. This information helps to isolate the cause of the resolution degradation, which for location dependent variations, is likely due to focus or astigmatism variations. Other pattern dependent effects (e.g., electron beam proximity effect) would be consistent throughout the various feature patterns 16 in field.

In addition to feature patterns 16, test pattern 10 can include horizontal line patterns 18 and vertical line patterns 20. Illustrative horizontal and vertical line patterns 18, 20 will be discussed below with reference to FIGS. 2–4. Horizontal line patterns 18 are located within test pattern 10 so that at least one horizontal line pattern 18 is located in each column 14A–E of test pattern 10. Similarly, vertical line patterns 20 are located within test pattern 10 so that at least one vertical line pattern 20 is located in each row 12A–E of test pattern 10. The placement of horizontal line patterns 18 and vertical line patterns 20 in this manner provides a high degree of likelihood that any cut through the area of a resist coated substrate (e.g., a wafer) exposed lithographically with test pattern 10 and processed to create images, would cleave lines in the appropriate orientation. Inclusion of horizontal line patterns 18 and vertical line patterns 20 thus allows for increased three dimensional analysis. For example, the quality of the feature side wall profiles can be analyzed by substantially tilting (up to ninety degrees) a cleaved substrate to view cross sectioned lines.

Figure 2:
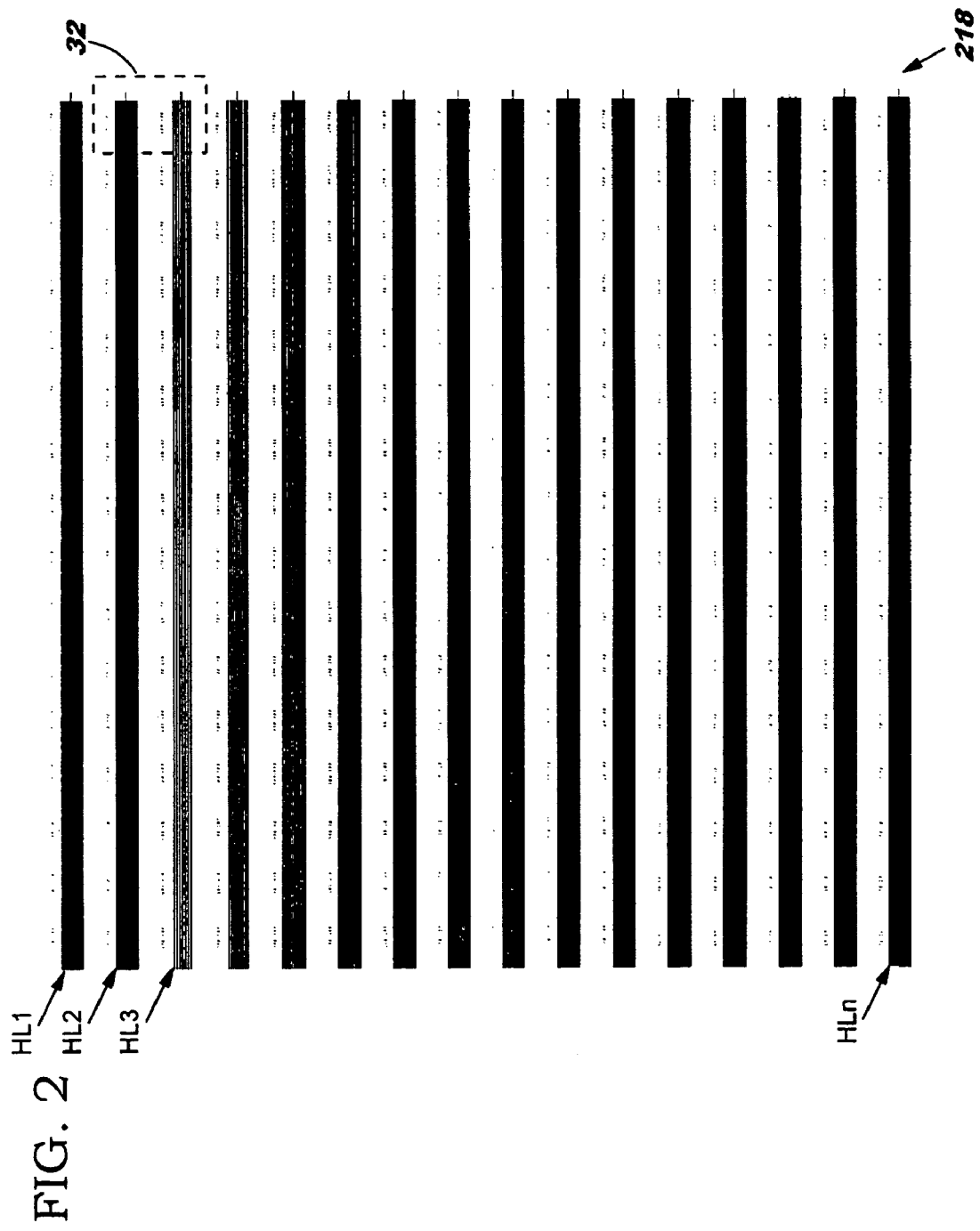
FIG. 2 shows an illustrative horizontal line pattern according to another embodiment of the invention.
Figure 3:
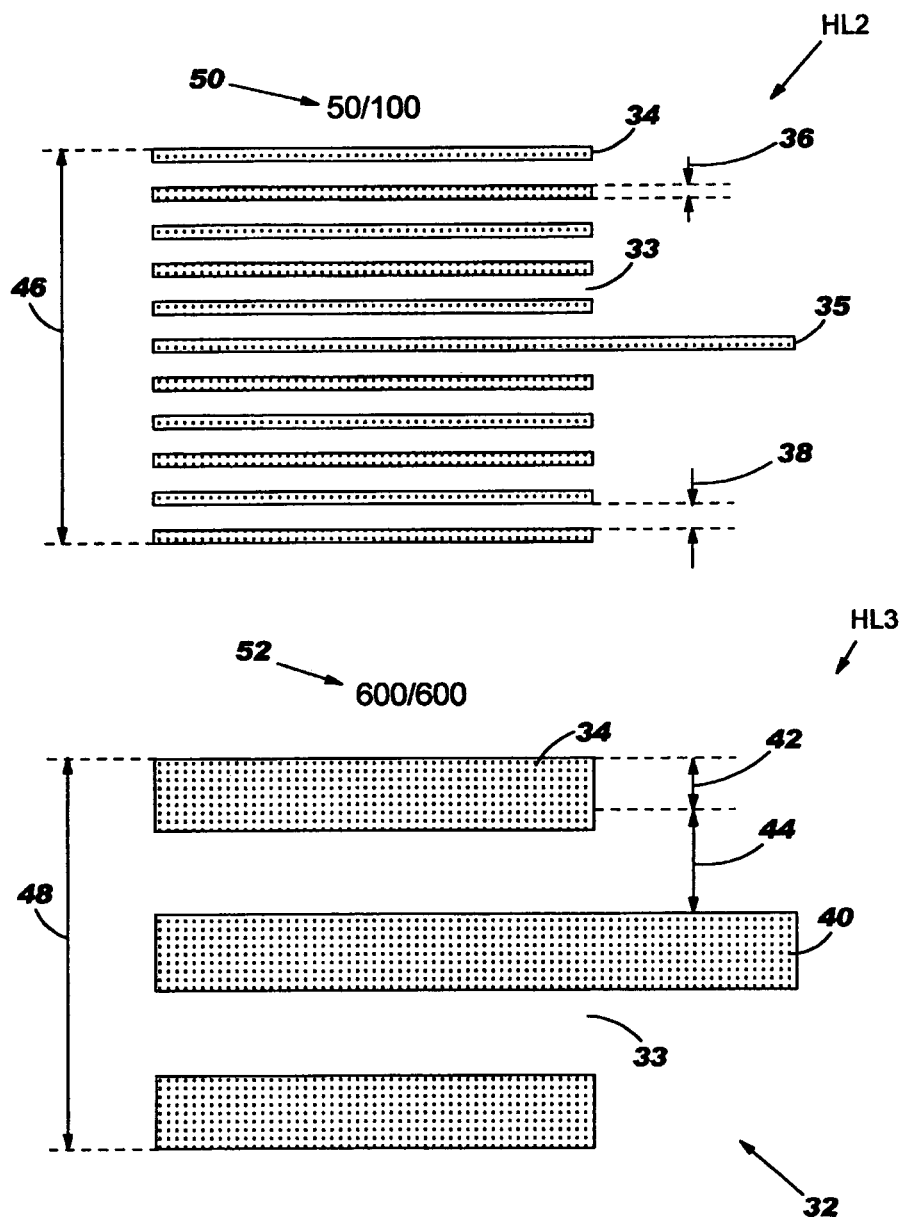
FIG. 3 shows an enlarged view of a portion of the horizontal line pattern shown in FIG. 2.

FIG. 2 shows an illustrative horizontal line pattern 218, and FIG. 3 shows an enlarged view of an area 32 of horizontal line pattern 218. Horizontal line pattern 218 includes multiple sets of horizontal lines HL1–HLn, where n can be any integer greater than one. Horizontal line pattern 218 is shown including sixteen sets of horizontal lines HL. Each set of horizontal lines HL includes multiple "lines" each having an equivalent line width, and separated from adjacent lines by "spaces" having a set space width (i.e., grouped lines and spaces). The terminology adopted herein assumes a positive photoresist imaging material. As shown in FIG. 3, a line 33 comprises an elongated area of a substrate that is not exposed by the lithography tool, while a space 34 comprises an elongated area of the substrate that is exposed by the lithography tool. For evaluating the lithography tool resolution, the widths of the lines and/or spaces can be varied between sets of horizontal lines HL (FIG. 2). The selected line and space widths are dependent upon a nominal resolution of the lithography tool. In one embodiment, the line and space widths vary from less than the nominal resolution limit to greater than the nominal resolution limit. Line and space widths several times greater than the nominal resolution limit (e.g., ten or twenty times the nominal resolution) can be included. Widths that vary in this manner provide a sufficient test range to ensure that the actual resolution of the lithography tool at various scales is accurately determined.

The test pattern provided by the invention is discussed using illustrative widths selected to evaluate a lithography tool that has a nominal resolution of approximately 100 nanometers. In one embodiment, the chosen line and space widths for sets of horizontal lines HL vary from approximately 50 nanometers to approximately 600 nanometers. By starting at approximately 50 nanometers, it is nearly assured that at least some of the sets of horizontal lines HL will be too narrow to be resolved by the lithography tool. By exposing features as large as approximately 600 nanometers (up to 2,000 nanometers for other patterns discussed below), the uniformity of the lithography tool can be analyzed over a range of image sizes. For example, critical dimension (CD) measurements can be made for various image sizes. Such analysis provides additional insight into exposure condition(s) limiting the tool resolution. The line and/or space widths can be incremented by a constant amount, or by variable amounts that are dependent upon how close the widths are to the resolution. The increments selected also depend on the number of sets of horizontal lines HL being used.

In horizontal line pattern 218 shown in FIG. 2, fourteen sets of horizontal lines HL3–HLn are used that have line and space widths of the same size. The selected widths are approximately 50 nanometers for set of horizontal lines HLn, followed by approximately 60, 70, 80, 90, 100, 110, 125, 150, 200, 300, 400, 500, and 600 nanometers for set of horizontal lines HL3. In addition, horizontal line pattern 218 includes sets of horizontal lines HL1, HL2 in which the line widths are twice the space widths. Set of horizontal lines HL2 has lines with an approximately 100 nanometer line width that are separated by approximately 50 nanometer wide spaces, while set of horizontal lines HL1 has lines with an approximately 200 nanometer line width that are separated by approximately 100 nanometer wide spaces. Various alternatives to the particular configuration of horizontal line pattern 218 are possible. For example, sets of horizontal lines HL1, HL2 could have spaces that are twice the size of the line widths.

FIG. 3 shows an enlarged view of sets of lines HL2, HL3. As discussed above, set of lines HL2 includes multiple lines 33 that each have a width 38 of approximately 100 nanometers and that are separated by spaces 34 having a width 36 of approximately 50 nanometers. Similarly, set of lines HL3 includes multiple lines 33 that each have a width 44 of approximately 600 nanometers and that are separated by spaces 34 having a width 42 of approximately 600 nanometers. In one alternative embodiment, each set of lines HL2, HL3 can be based on finger arrays. As a result, each set of lines HL2, HL3 includes an extended space 35, 40, respectively, that extends beyond the other spaces 34 in each set. However, extended spaces 35, 40 for each set of lines HL2, HL3 may not be separately analyzed. Further, each set of lines HL2, HL3 is shown including a maximum number of lines and spaces that can be located within an approximately equal width 46, 48, respectively. As a result, set of lines HL2 includes more lines 33 and spaces 34 than set of lines HL3. It is understood however, that various alternatives are possible, including each set of lines HL having a same number of lines. Still further, horizontal line pattern 218 (FIG. 2) may also include the labels 50, 52 for the line and/or space widths for each set of lines HL. By including labels 50, 52, an individual inspecting the processed test pattern images can readily determine the target widths of the test pattern, and compare the actual widths produced by the lithography tool.

Figure 4:
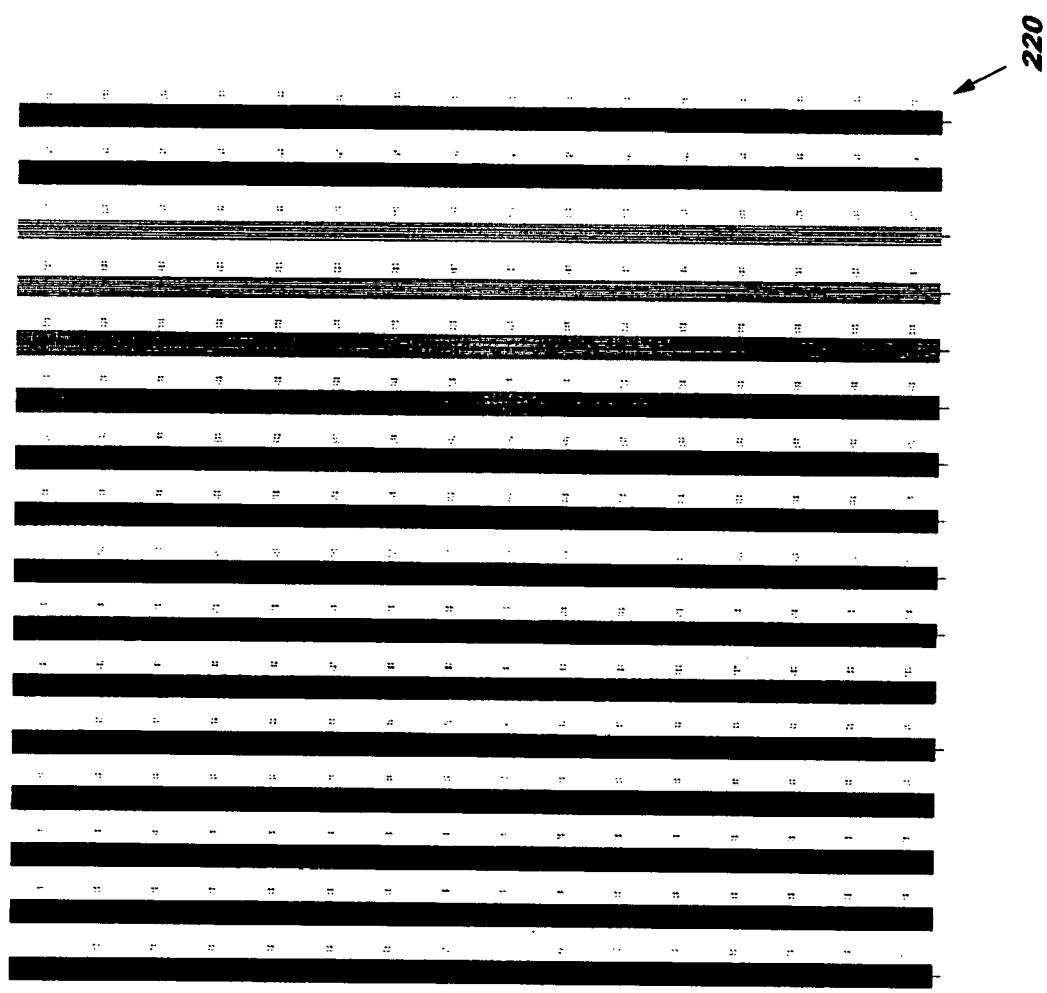
FIG. 4 shows an illustrative vertical line pattern according to another aspect of the invention.

FIG. 4 shows an illustrative vertical line pattern 220. Vertical line pattern 220 is configured substantially the same as horizontal line pattern 218 (FIGS. 2 and 3). In particular, vertical line pattern also includes multiple sets of lines, in which the space widths and line widths for the sets of lines vary from less than a nominal resolution limit of the lithography tool to greater than the nominal resolution limit, and the labels for the line and space widths for each set of lines are also included in the pattern design data. However, the sets of lines in vertical line pattern 220 are rotated ninety degrees as compared to the horizontal line pattern 218.

Figure 5:
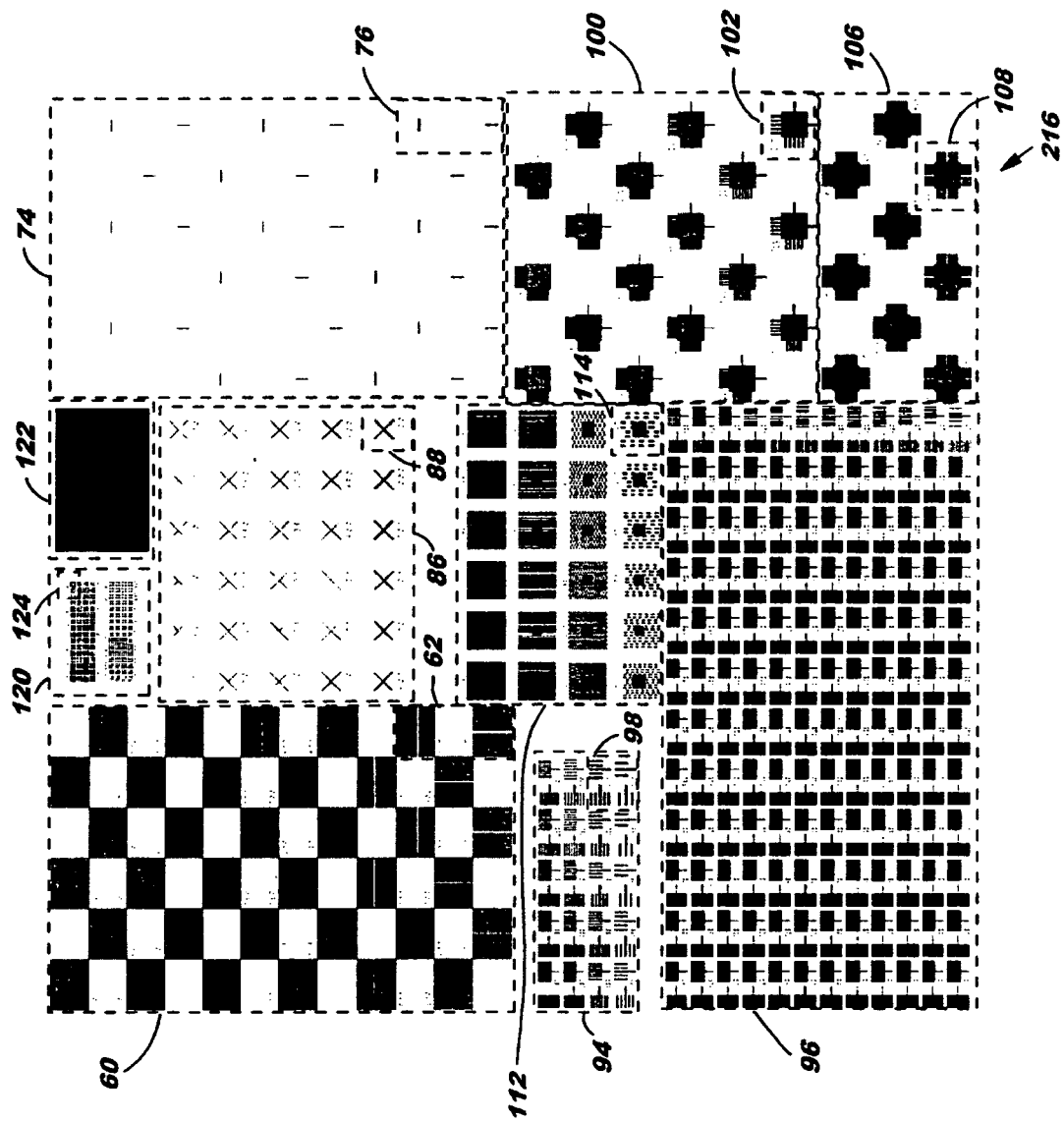
FIG. 5 shows an illustrative feature pattern according to another embodiment of the invention.

FIG. 5 shows an illustrative feature pattern 216. Feature pattern 216 is shown including various sub-patterns in which each sub-pattern includes one or more of the features commonly produced by the lithography tool. The features included in feature pattern 216 can be selected to provide a comprehensive evaluation of the lithography tool. For example, the features can include isolated lines, isolated spaces, finger arrays, contact holes, positive and negative tone holes, diagonal crosses, etc. By combining these features into a single feature pattern 216, numerous performance characteristics of the lithography can be simultaneously analyzed. In particular, some features will exhibit resolution degradation before other features. For example, during exposure, finger arrays and isolated lines may receive a proximity dose boost due to the scattering of exposure radiation from nearby exposed areas. This may cause these features to clear while isolated spaces remain only partially resolved. Further, two dimensional features such as contact holes can be more difficult to clear than the one dimensional isolated spaces. Still further, including diagonal crosses allows for the analysis and correction of off-axis aberrations, which may go undetected when analyzing horizontal and vertical features.

As with horizontal line pattern 218 (FIG. 2) and vertical line pattern 220 (FIG. 4), each sub-pattern includes one or more features that vary in size from less than a nominal resolution to greater than the nominal resolution of the lithography tool being evaluated. Features smaller than the nominal resolution limit are included to explore how far the tool resolution can be extended and because partially cleared spaces are particularly sensitive to electron optical aberrations that limit resolution. Features significantly greater than the resolution limit are also incorporated in the test pattern. This enables evaluation of linearity (ideally a unity slope curve of measured feature size vs. designed feature size. On an electron beam lithography tool, it is possible for larger features to become increasingly defocused due to an increased exposure spot current and an associated increase in electron Coulomb interactions. Also the calibration errors of the electron beam shaping deflection can be detected by examining the measured widths of a range of developed space sizes.

Figure 6:
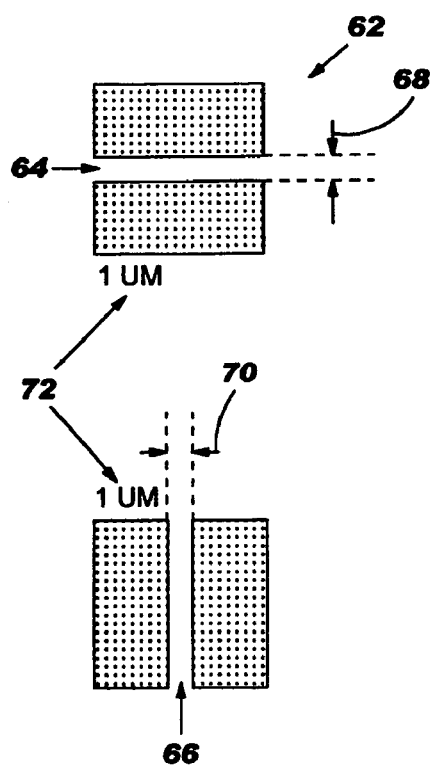
FIG. 6 shows a close up view of a first area of the feature pattern shown in FIG. 5.

Feature pattern 216 includes a sub-pattern 60 that comprises a set of isolated lines. Set of isolated lines 60 includes both horizontal and vertical lines that are shown having progressively smaller widths as they move from an area 62 at one corner of set of isolated lines 60 to the opposite corner of set of isolated lines 60. In one embodiment, the selected widths range from approximately 50 nanometers to approximately 1,000 nanometers (1 micrometer) with intervening widths of approximately 60, 70, 80, 90, 100, 110, 125, 150, 200, 300, 400, 500, 600, 700, 800, and 900 nanometers. An enlarged view of area 62 of set of isolated lines 60 is shown in FIG. 6. Area 62 includes a horizontal line 64 and a vertical line 66. Both horizontal line 64 and vertical line 66 have respective target widths 68, 70 of, for example, approximately 1 micrometer. The target width label 72 may be included adjacent each line 64, 66 to facilitate analysis of the exposed substrate field.

Figure 7:
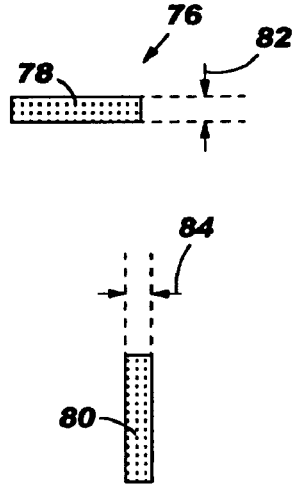
FIG. 7 shows a close up view of a second area of the feature pattern shown in FIG. 5.

Returning to FIG. 5, sub-pattern 74 comprises a set of isolated spaces. Similar to set of isolated lines 60, set of isolated spaces 74 includes horizontal and vertical spaces that have widths varying from greater than the nominal resolution limit of the lithography tool to less than the nominal resolution limit. An enlarged view of area 76 of set of isolated spaces 74 is shown in FIG. 7. Area 76 includes a horizontal space 78 and a vertical space 80 having respective target widths 82, 84 of, for example, approximately 1 micrometer. The remainder of set of isolated spaces 74 (FIG. 5) comprises similar horizontal spaces 78 (FIG. 7) and vertical spaces 80 (FIG. 7) having progressively smaller widths 82, 84 (FIG. 7) as they progress through set of isolated spaces 74. The selected widths are the same as those used for set of isolated lines 60. However, unlike set of isolated lines 60, set of isolated spaces 74 may not include labels as part of the pattern. Further, each space 78, 80 may have a shorter length than the lines used in set of isolated lines 60. These differences allow each isolated space to maintain a larger isolation from other spaces to improve the analysis of the generated test images.

Figure 8:
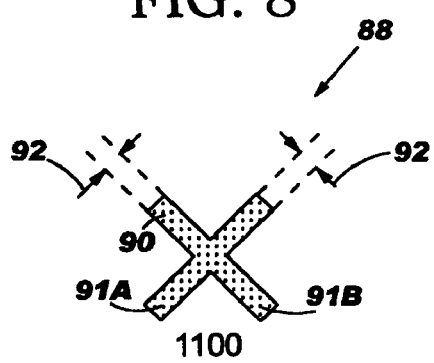
FIG. 8 shows a close up view of a third area of the feature pattern shown in FIG. 5.

With continuing reference to FIG. 5, sub-pattern 86 comprises a set of diagonal crosses. FIG. 8 shows an enlarged view of an area 88 of set of diagonal crosses 86. Area 88 includes a diagonal cross 90 that is made up of two forty-five degree spaces 91A, 91B that intersect at approximately their respective centers. The spaces 91A, 91B in each diagonal cross 90 have a width 92 that varies from greater than the nominal resolution limit to less than the nominal resolution limit of the lithography tool throughout set of diagonal crosses 86 (FIG. 5). In set of diagonal crosses 86 shown in FIG. 5, the widths vary from approximately 50 to approximately 220 nanometers in increments of, for example, ten nanometers, approximately 250 to approximately 500 nanometers in increments of, for example, fifty nanometers, and approximately 600 to approximately 1,100 nanometers in increments of one hundred nanometers. Set of diagonal crosses 86 allows for the analysis over a range of widths of sub-resolution exposed spots that are typically used on an electron beam lithography tool to generate the forty-five degree spaces.

Figure 9:
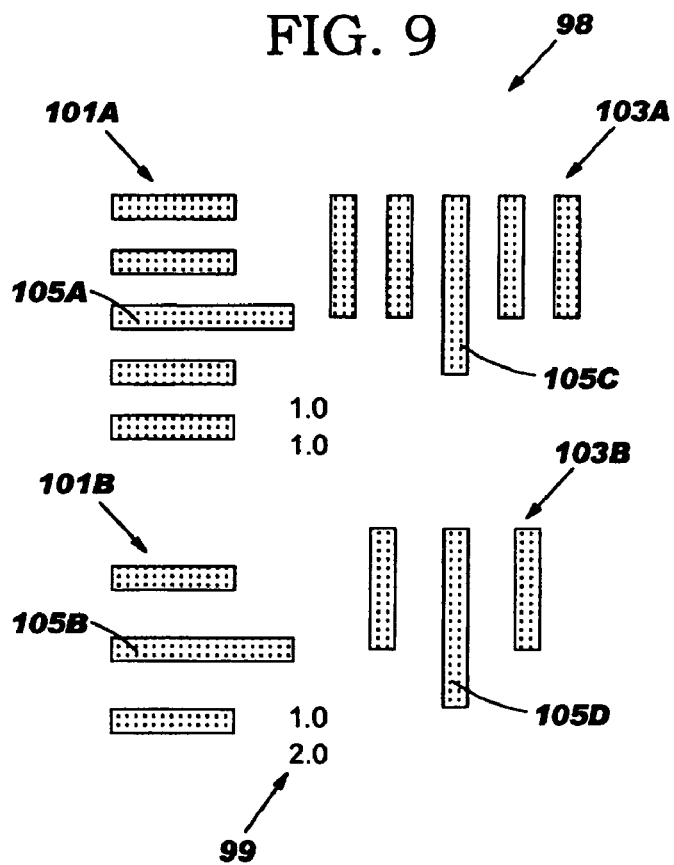
FIG. 9 shows a close up view of a fourth area of the feature pattern shown in FIG. 5.

Continuing with FIG. 5, sub-patterns 94, 96 each comprise a set of finger arrays. Sets of finger arrays 94, 96 include interleaved columns of horizontal finger arrays and vertical finger arrays. An enlarged view of area 98 of set of finger arrays 94 is shown in FIG. 9. As shown, each horizontal finger array 101A, 101B is configured-similar to a set of horizontal lines in horizontal line pattern 218 (FIG. 2), and each vertical finger array 103A, 103B is configured similar to a set of vertical lines in vertical line pattern 220 (FIG. 4). Each finger array 101A–B, 103A–B includes an extended space 105A–D, respectively, that extends beyond the other spaces in each finger array. Extended spaces 105A–D provide semi-isolated spaces that can further assist in characterizing the resolution achieved by the lithography tool. Adjacent horizontal and vertical finger arrays (i.e., finger arrays 101A, 103A) are configured to have the same line and space widths so that the width labels 99 can be written between the two adjacent columns, thereby reducing the number of width labels 99 that require writing. Sets of finger arrays 94, 96 include finger arrays that have more combinations of line and space width than the horizontal and vertical line patterns discussed As shown in FIG. 9, finger arrays 101A, 103A include lines and spaces having the same width, and finger arrays 101B, 103B include lines having twice the width of the spaces. For sets of finger arrays 94, 96 shown in FIG. 5, set of finger arrays 94 includes vertical and horizontal finger arrays that have spaces with widths ranging from approximately 100 to approximately 1,000 nanometers in increments of, for example, approximately 100 nanometers that are grouped with lines of the same width, and lines having twice the width. Set of finger arrays 96 includes horizontal and vertical finger arrays having each combination of line and space widths that range from approximately 50 to approximately 130 nanometers in increments of, for example, approximately ten nanometers, as well as approximately 150, 250, and 500 nanometers.

Figure 10:
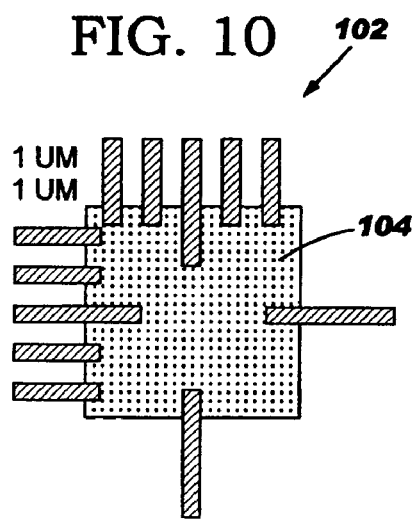
FIG. 10 shows a close up view of a fifth area of the feature pattern shown in FIG. 5.

Also in FIG. 5, sub-pattern 100 comprises a set of rectangles in which each side of each rectangle has one or more horizontal or vertical spaces intersecting it. An enlarged view of area 102 of set of rectangles 100 is shown in FIG. 10. As positioned, a rectangle 104 includes a set of vertical spaces intersecting its first (top) side, an isolated vertical space intersecting its second (bottom) side, a set of horizontal spaces intersecting its third (left) side, and an isolated horizontal space intersecting its fourth (right) side. It is understood that this is only illustrative, and the various positions can be altered (e.g., rotated). In one embodiment, each rectangle 104 may comprise a square having a width and height of approximately twelve micrometers, while the widths for the sets of vertical and horizontal spaces varies for each rectangle 104 in set of rectangles 100 (FIG. 5). The exposed rectangles define clear spaces in the developed image that enable tilted viewing of the intersecting lines and spaces (pseudo three dimensional analysis). A rectangle size of twelve micrometers is sufficient to allow sixty degree tilted viewing of the feature end profiles. As shown in FIG. 5, the line and space widths for the sets of spaces for each rectangle in set of rectangles 100 may have the same value that is selected from approximately 50, 60, 70, 80, 90, 100, 110, 125, 150, 200, 300, 400, 500, 600, 700, 800, 900, and 1,000 nanometers.

Figure 11:
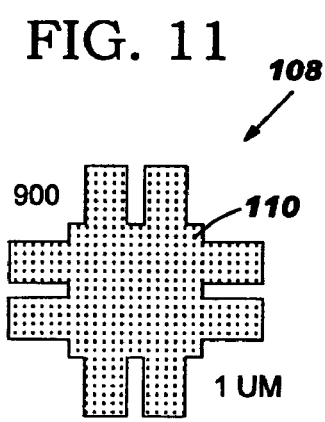
FIG. 11 shows a close up view of a sixth area of the feature pattern shown in FIG. 5.

Continuing to refer to FIG. 5, sub-pattern 106 also comprises a set of similarly sized rectangles. An enlarged view of area 108 of set of rectangles 106 is shown in FIG. 11. As positioned, each rectangle includes horizontal isolated lines that extend from its first (right) and second (left) sides, and vertical isolated lines that extend from its third (top) and fourth (bottom) side. In one embodiment, rectangle 110 may comprise a twelve micrometer square having approximately 1,000 nanometer (1 micrometer) isolated lines extending from its bottom and right sides, and approximately 900 nanometer isolated lines extending from its top and left sides. As a result, rectangle 110 has a horizontal and vertical line pair having a first width, and a second horizontal and vertical line pair having a second width. Each rectangle 110 in set of rectangles 106 (FIG. 5) is configured similarly. Consequently, the nine rectangles shown in set of rectangles 106 in FIG. 5, may include vertical and horizontal line pairs that have the same widths as the sets of spaces included in set of rectangles 100. Sub-patterns 100, 106 enable pseudo three dimensional analysis of the lithography tool imaging results with substrate tilts up to sixty degrees. This provides improved analysis as opposed to merely viewing the specimen from above. For example, the sidewall profiles of the exposed images can examined by tilting the substrate with processed images on a scanning electron microscope up to approximately sixty degrees.

Figure 12:
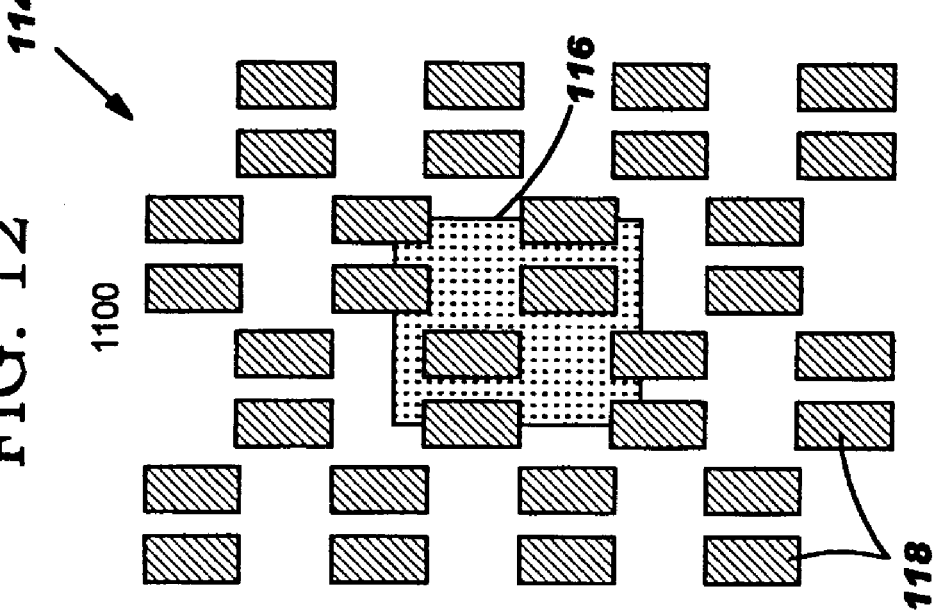
FIG. 12 shows a close up view of a seventh area of the feature pattern shown in FIG. 5.

Also shown in FIG. 5, sub-pattern 112 comprises sets of "contact holes." A "hole" comprises a two dimensional space that is exposed by the lithography tool and has a more square aspect ratio. An enlarged view of area 114 of sets of contact holes 112 is shown in FIG. 12. In one embodiment, each "contact hole" set includes an exposed square 116. Exposed square 116 enables tilted viewing of the contact hole sidewalls. The twelve micrometer exposed square 116 is superimposed upon a geometric pattern of contact holes 118. While a particular geometric pattern is shown, this pattern is only intended to be illustrative, and other patterns can be used. The width and length of contact holes 118 is varied for each set of contact holes. For the example shown, the length of each contact hole is always twice the width. In set of contact holes 112 shown in FIG. 5, the widths comprise approximately 50 to approximately 160 nanometers in increments of, for example, approximately ten nanometers, approximately 200 to approximately 400 nanometers in increments of, for example, approximately fifty nanometers, and approximately 500 to approximately 1,100 nanometers in increments of one hundred nanometers. The inclusion of sets of contact holes 112 allows for two dimensional features to be analyzed along with the more one dimensional lines and spaces of the sub-patterns discussed previously. Further, sets of contact holes 112 provides for the evaluation of the sidewall profiles of sets of contact holes 112 by tilting the substrate with processed images on a scanning electron microscope up to approximately 60 degrees and utilizing exposed square 116.

Feature pattern 216 in FIG. 5 also includes sub-patterns 120 and 122. Sub-pattern 120 comprises multiple sets of positive tone holes, while sub-pattern 122 comprises multiple sets of negative tone holes. The positive tone holes result in resist cavities after exposure and development of the photoresist, while the negative tone holes result in photoresist pedestals standing on a clear background when the resist processing is completed. Sets of positive tone holes 120 and sets of negative tone holes 122 ensure that the resolution analysis is carried out under consistent exposure dose conditions. Underdosed features are difficult to distinguish from features that are unresolved due to electron optical aberrations (e.g., defocus, astigmatism, etc.). Under proper dosage conditions, the size of the minimum resolvable positive tone hole and the minimum resolvable negative tone hole as limited by electron optical aberrations should be roughly the same since the exposed feature sizes are equivalent. Smaller resolvable positive tone holes may indicate that the exposure dose is too high, while smaller resolvable negative tone holes may indicate that the exposure dose is too low.

Figure 13:
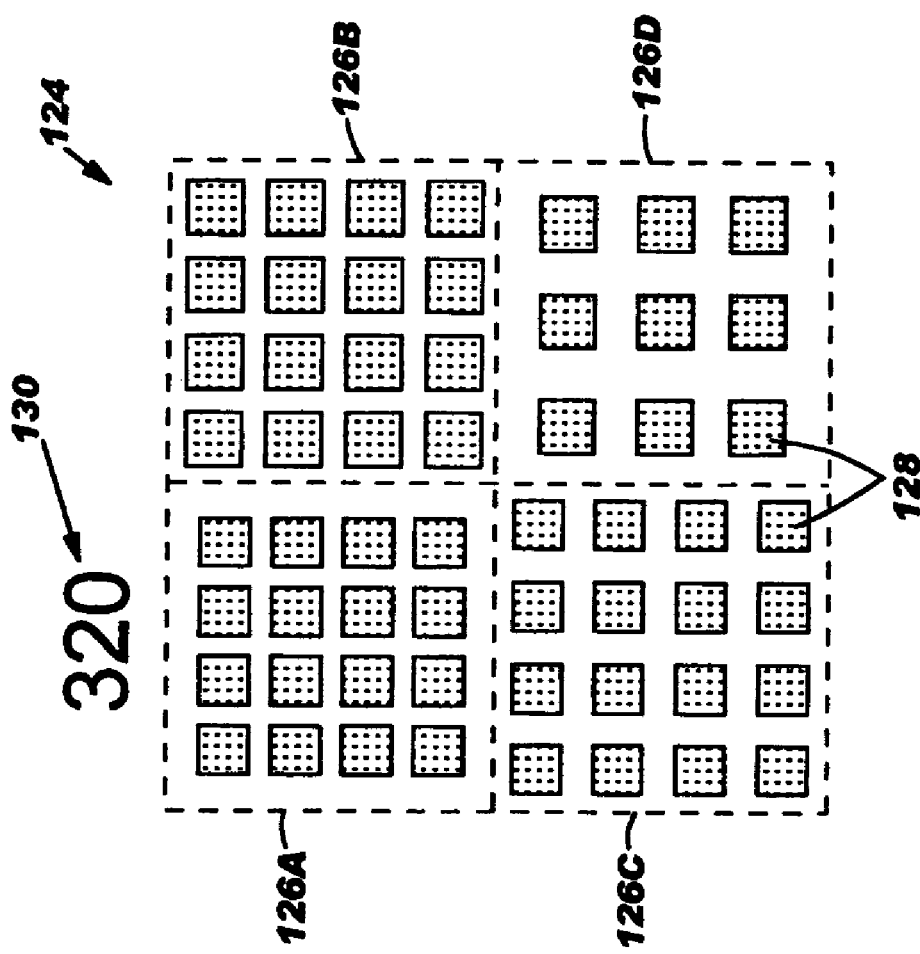
FIG. 13 shows a close up view of an eighth area of the feature pattern shown in FIG. 5.

FIG. 13 shows an enlarged view of an area 124 of sub-pattern 120. Four sets of positive tone holes 126A–D are shown. Each set of positive tone holes 126A–D comprises multiple two dimensional holes 128. Each hole 128 in a set of positive tone holes 126A–D comprises a square space that is the same size as the other holes 128 in the set. Each hole 128 is also separated from the other holes 128 in the set by a set gap of equal size to the holes. In one embodiment, the hole sizes for the sets of positive tone holes 126A–D vary from approximately 50 nanometers to approximately 685 nanometers in increments of, for example, approximately 5 nanometers. To assist in analyzing the pattern, a label 130 for the hole size of the first set of holes in each column is included above every other column, while a label for the size of the last set of holes is included below the remaining columns. Sub-pattern 122 may be configured the same as sub-pattern 120 with the exception that the image tone is reversed. That is, the gap areas are exposed and the hole areas are not exposed. For this reason, the features in sub-pattern 122 are referred to as negative tone holes. As a result, sub-pattern 122 is not separately discussed for brevity.

Figure 14:
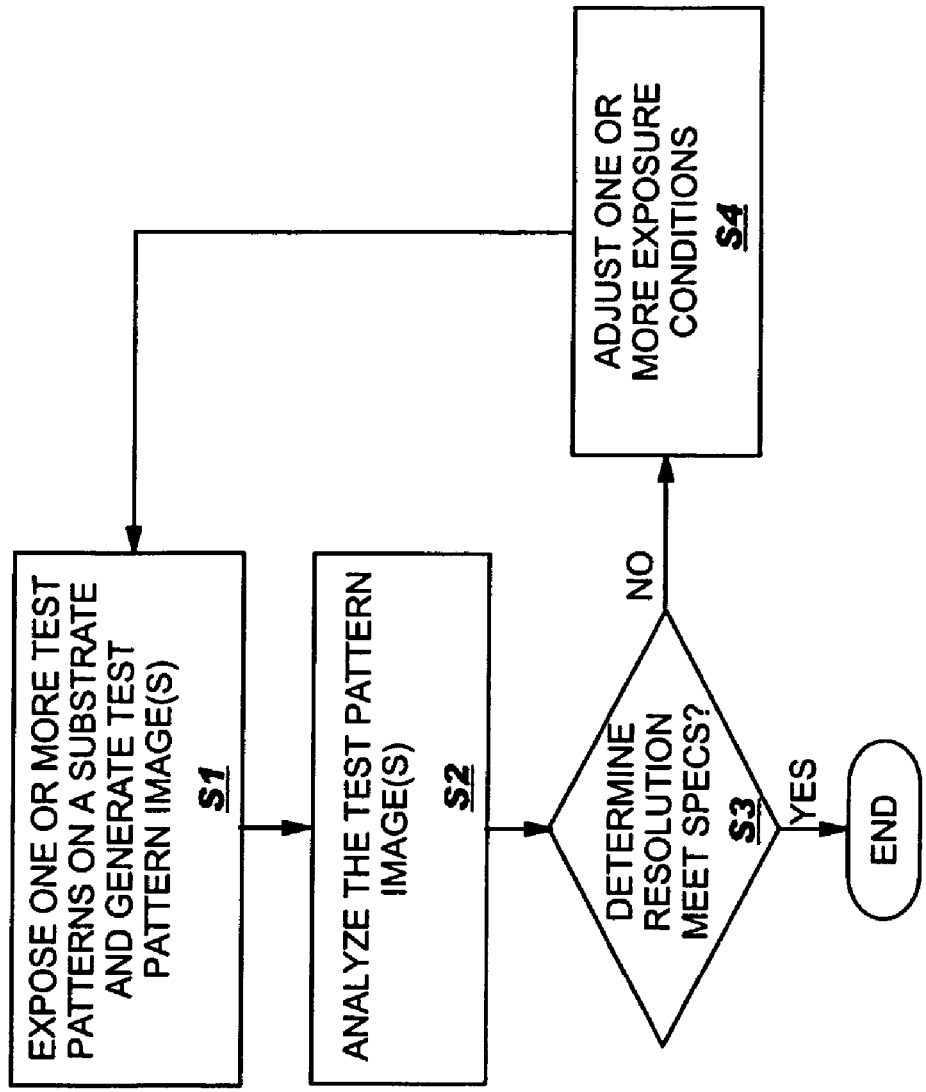
FIG. 14 shows illustrative method steps according to the invention.

In operation, FIG. 14 shows illustrative method steps for evaluating a lithography tool using the test pattern discussed above. In step S1, one or more test patterns are exposed on an electron beam sensitive resist coated substrate that is developed to generate one or more test pattern images. When multiple test patterns are exposed, one or more lithography tool exposure conditions (e.g., focus coil excitation, stigmator correction coil excitation, and beam exposure time) can be varied for each test pattern exposure. Examining test pattern images exposed at varying exposure conditions away from nominal can increase the evaluation sensitivity for the remaining variables (e.g., underdosed images degrade much faster as the focus value is changed from the optimal value). In step S2, the one or more test pattern images are analyzed to evaluate the resolution of the lithography tool. In one embodiment, analysis includes measuring and/or examining one or more critical dimensions of the test pattern images using a scanning electron microscope. By including the feature pattern in various critical locations in the test pattern (i.e., center, corners, etc.), the analysis can determine if a critical dimension varies by location in the test pattern image.

In step S3, the lithography tool resolution is determined from the analyzed test pattern images. If the determined resolution meets the lithography tool specifications for the nominal exposure conditions, the lithography tool set up is complete and the process terminates. However, if the specified resolution is not achieved or is achieved at exposure conditions away from nominal, the process continues to step S4. In step S4, one or more exposure conditions of the lithography tool are adjusted. For example, focus correction, astigmatism correction or exposure dose can be varied based on evaluation of the feature patterns in the test pattern image(s). Whenever additional analysis is desired, the process returns to step S1. Since the test pattern allows for simultaneous evaluation of critical dimensions at multiple locations in the field and for a range of feature types and sizes, fewer repetitions should be required. As a result, testing the lithography tool is performed more efficiently.

It is understood that the method steps discussed can be performed by a processor, a human, or any combination thereof. The processor can comprise a central processing unit of a computer system, executing instructions of program product stored in memory. For example, the method steps may be performed by program code configured to test a lithography tool. It is understood that the various devices, modules, mechanisms and systems for executing this program product may be realized in hardware, software, or a combination of hardware and software, and may be compartmentalized in various ways. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

It is understood that the various method steps, patterns, and arrangements of patterns discussed herein are only illustrative of the teachings of the invention. Further, the selected widths, feature dimensions, and geometric patterns are also only provided as an illustrative embodiment of the invention. Still further, while most patterns are arranged so that features increase in size from top to bottom and/or left to right, this is only one possible arrangement for the features. As a result, the foregoing description of various embodiments of the invention is presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

The invention claimed is:

1. A test pattern comprising:
a plurality of feature patterns;
a plurality of horizontal line patterns; and
a plurality of vertical line patterns, wherein the feature patterns are interleaved with the horizontal line patterns and the vertical line patterns such that substantially all of a vertical area of the test pattern intersects at least one horizontal line pattern and substantially all of a horizontal area of the test pattern intersects at least one vertical line pattern, and wherein each horizontal line pattern and each vertical line pattern includes a plurality of sets of lines, wherein each set of lines includes a plurality of lines and each line in a set of lines has an identical line width and is separated from an adjacent line by a space having a space width, and wherein the line width and the space width for the plurality of sets of lines varies from less than a nominal resolution limit of a lithography tool to greater than the nominal resolution limit.

2. The test pattern of claim 1, wherein the test pattern includes a plurality of rows and a plurality of columns, and wherein at least one horizontal line pattern is located in each column of the test pattern and at least one vertical line pattern is located in each row of the test pattern.

3. The test pattern of claim 1, wherein each feature pattern includes:
   a plurality of sets of positive tone holes; and
   a plurality of sets of negative tone holes; wherein each set of holes includes a plurality of holes having an identical size, and wherein the sizes for the plurality of sets of holes vary from less than a nominal resolution limit of a lithography tool to greater than the nominal resolution limit.

4. The test pattern of claim 1, wherein each feature pattern includes:
   a set of isolated lines;
   a set of isolated spaces;
   a set of finger arrays; and
   a set of contact holes;
   wherein each set includes at least one feature size that varies from less than a nominal resolution limit of a lithography tool to greater than the nominal resolution limit.

5. The test pattern of claim 1, wherein a first feature pattern is located at the center of the test pattern.

6. The test pattern of claim 5, wherein each corner of the test pattern includes a feature pattern.

7. The test pattern of claim 6, wherein a midpoint of each radius of the test pattern includes a feature pattern.

8. The test pattern of claim 7, wherein a midpoint of each side of the test pattern includes a feature pattern.

9. A test pattern comprising:
   a plurality of feature patterns, wherein each feature pattern includes a plurality of sub-patterns that include:
      a set of finger arrays;
      a plurality of sets of positive tone holes; and
      a plurality of sets of negative tone holes;
   wherein each sub-pattern includes at least one feature size that varies in size from less than a nominal resolution limit of a lithography tool to greater than the nominal resolution limit.

10. The test pattern of claim 9, further comprising a plurality of horizontal line patterns interleaved with the feature patterns.

11. The test pattern of claim 9, further comprising a plurality of vertical line patterns interleaved with the feature patterns.

12. The test pattern of claim 9, wherein the plurality of sub-patterns further include a set of contact holes.

13. The test pattern of claim 9, wherein the plurality of sub-patterns further include:
   a set of isolated lines;
   a set of isolated spaces;
   a set of diagonal crosses;
   a set of rectangles having intersecting isolated spaces; and
   a set of rectangles having isolated lines extending therefrom.

14. The test pattern of claim 9, wherein a first feature pattern is located at the center of the test pattern and each corner of the test pattern includes a feature pattern.

15. The test pattern of claim 9, wherein a midpoint of each radius of the test pattern includes a feature pattern and a midpoint of each side of the test pattern includes a feature pattern.

16. A method of evaluating a lithography tool resolution, the method comprising:
   exposing a test pattern on a resist coated substrate and generating a test pattern image, wherein the test pattern includes:
      a plurality of horizontal line patterns;
      a plurality of vertical line patterns; and
      a plurality of feature patterns interleaved with the horizontal line patterns and the vertical line patterns, wherein each feature pattern includes a plurality of sub-patterns, and wherein the plurality of sub-patterns include:
         a plurality of sets of positive tone holes; and
         a plurality of sets of negative tone holes;
         wherein each sub-pattern includes at least one feature size that varies in size from less than a nominal resolution limit of the lithography tool to greater than the nominal resolution limit; and
   analyzing the test pattern image to evaluate the lithography tool resolution.

17. The method of claim 16, further comprising:
   varying at least one exposure condition selected from the group consisting of: a focus coil excitation, a stigmator correction coil excitation, and a beam exposure time; and
   repeating the exposing step for a second location on the test substrate using the at least one varied exposure condition.

18. The method of claim 16, wherein the analyzing step includes:
   measuring at least one critical dimension of the test pattern image; and
   examining the test pattern image using a microscope.

19. The method of claim 18, further comprising adjusting the lithography tool resolution based on the analysis of the test pattern image.

20. The method of claim 19, wherein the adjusting step includes correcting at least one of focus and astigmatism based on feature patterns in the test pattern image, wherein the feature patterns are located at a center of the test pattern image, each corner of the test pattern image, a midpoint of each radius of the test pattern image, and a midpoint of each side of the test pattern image.

* * * * *